US011434562B2

(12) United States Patent
Saitou

(10) Patent No.: US 11,434,562 B2
(45) Date of Patent: Sep. 6, 2022

(54) CAN-ROLLER FOR VACUUM PROCESSING APPARATUS

(71) Applicant: ULVAC, INC., Kanagawa (JP)

(72) Inventor: Shuuji Saitou, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 17/604,676

(22) PCT Filed: Dec. 27, 2019

(86) PCT No.: PCT/JP2019/051374
§ 371 (c)(1),
(2) Date: Oct. 18, 2021

(87) PCT Pub. No.: WO2020/230360
PCT Pub. Date: Nov. 19, 2020

(65) Prior Publication Data
US 2022/0145449 A1    May 12, 2022

(30) Foreign Application Priority Data
May 10, 2019  (JP) .............................. JP2019-089657

(51) Int. Cl.
*C23C 14/56*    (2006.01)
*C23C 14/54*    (2006.01)

(52) U.S. Cl.
CPC .............. *C23C 14/56* (2013.01); *C23C 14/54* (2013.01)

(58) Field of Classification Search
None
See application file for complete search history.

(56) References Cited

U.S. PATENT DOCUMENTS 7,025,123 B1 * 4/2006 Gerndt ...................... F28F 5/02
432/116

FOREIGN PATENT DOCUMENTS

JP    2002-535586 A    10/2002
JP    2002-339950 A    11/2002
(Continued)

OTHER PUBLICATIONS

International Search Report for PCT Patent App. No. PCT/JP2019/051374 (dated Feb. 10, 2020).
(Continued)

*Primary Examiner* — Shamim Ahmed
*Assistant Examiner* — Bradford M Gates
(74) *Attorney, Agent, or Firm* — Cermak Nakajima & McGowan LLP; Tomoko Nakajima

(57) ABSTRACT

In a vacuum processing apparatus for performing a predetermined vacuum processing on a surface of a sheet-like base material while keeping the base material to travel inside the vacuum chamber, the can-roller of this invention disposed to lie opposite to a vacuum processing unit has an axial body; an inner cylindrical body to be inserted onto an outside of the axial body; an outer cylindrical body enclosing an outer cylindrical surface of the inner cylindrical body with a gap therebetween, and cover bodies for respectively closing axial both ends of the inner cylindrical body. Each of the cover bodies has a plurality of flow passages. A cross-section of each of the fluid passages overlaps a cross-section of the cover body. A cross-sectional area of the gap between the inner cylindrical body and the outer cylindrical body is set to a size that can obtain a predetermined flow velocity.

5 Claims, 5 Drawing Sheets

(56) References Cited

FOREIGN PATENT DOCUMENTS

| | | |
|---|---|---|
| JP | 2010-163693 A | 7/2010 |
| JP | 2019-044272 A | 3/2019 |

OTHER PUBLICATIONS

International Preliminary Report on Patentability for PCT Patent App. No. PCT/JP2019/051374 (dated Nov. 25, 2021).
Explanation of Circumstances Concerning Accelerated Examination filed with the Japan Patent Office (dated Feb. 26, 2020) with English language translation thereof.

* cited by examiner

CAN-ROLLER FOR VACUUM PROCESSING APPARATUS

This application is a national phase entry under 35 U.S.C. § 371 of PCT Patent Application No. PCT/JP2019/051374, filed on Dec. 27, 2019, which claims priority under 35 U.S.C. § 119 to Japanese Patent Application No. 2019-089657, filed May 10, 2019, both of which are incorporated by reference.

TECHNICAL FIELD

The present invention relates to a can-roller for use in a vacuum processing apparatus in which predetermined vacuum processing is performed on a sheet-like base material while it is being travelled inside a vacuum chamber. The can-roller is disposed to lie opposite to a processing unit for performing vacuum processing, and has wound therearound the sheet-like base material. In more detail, the can-roller is used in an environment in which the heat input is acceptable at the time of vacuum processing.

BACKGROUND ART

A vacuum deposition apparatus which is provided with the above types of can-roller is known, e.g., in patent document 1. In this known apparatus, inside a vacuum chamber that is capable of forming a vacuum atmosphere therein: a sheet-like base material is continuously fed out of a feed roller; the sheet-like base material that has been fed out is wound around the can-roller; a predetermined vacuum processing is performed by a processing unit which is disposed opposite to that portion of the sheet-like base material which is wound around the can-roller; and the processed sheet-like base material is taken up by a take-up roller. The can-roller is provided with: an axial body; an inner cylindrical body to be inserted onto an outside of the axial body; an outer cylindrical body enclosing an outer cylindrical surface of the inner cylindrical body with a gap therebetween; and cover bodies for respectively closing axially each end of the inner cylindrical body and the outer cylindrical body. The axial body of the can-roller is arranged to be rotatably supported through bearings by a supporting body which is disposed on a wall surface of the vacuum chamber or inside the vacuum chamber.

When the predetermined processing is performed on the sheet-like base material, there is a case in which the can-roller and the sheet-like base material that has been taken up around the can-roller receives a heat input due to radiant heat and the like from the processing unit. In the above-mentioned known example, a cooling mechanism in the form of cooling water circulation system and the like is disposed inside the can-roller in order to cool the can-roller. As a result of heat exchanging with the cooled can-roller, the sheet-like base material is arranged not to be heated above a predetermined temperature. In such a case, it is considered to supply the cooling water from one axial direction of the cover body into the gap between the inner cylindrical body and the outer cylindrical body and discharge the cooling water out of the other axial direction of the cover body. For that purpose, the cover body must be provided with a flow passage for the cooling water. Here, as noted above, in case the can-roller is arranged, the total amount (volume) of the cooling water shall preferably be as small as possible when bad effect of rotation for driving the can-roller. Further, the flow passage to be disposed on the cover body must be constituted not to cause the enlargement of the can-roller, considering the point that the flow passage does not contribute to the heat exchanging with the sheet-like base material. On this occasion, if the area of the flow passage is large, the heat absorbing area or the heat radiation area becomes larger, thereby resulting in lowering of the heat exchange effectiveness with the sheet-like base material. Therefore, it is also necessary to restrain the above problem to the extent possible.

PRIOR ART DOCUMENTS

Patent Documents

Patent Document 1: JP-A-2010-163693

SUMMARY OF THE INVENTION

Problems that the Invention is to Solve

In view of the above-mentioned points, this invention has a problem of providing a can-roller which can be made smaller in size in the axial direction and in which lowering of heat exchange effectiveness can be restrained to the extent possible.

Means for Solving the Problems

In order to solve the above-mentioned problems, there is provided a can-roller for a vacuum processing apparatus which performs a predetermined vacuum processing inside a vacuum chamber on a surface of a sheet-like base material while keeping the base material travelling, the can-roller being disposed to lie opposite to a processing unit which performs the vacuum processing, the can-roller being rotatable and around which the sheet-like base material is wound. The can-roller comprises: an axial body; an inner cylindrical body to be inserted onto an outside of the axial body; an outer cylindrical body enclosing an outer cylindrical surface of the inner cylindrical body with a gap therebetween; and cover bodies for respectively closing axially each end of the inner cylindrical body and the outer cylindrical body. In the can-roller, each of the cover bodies has a plurality of flow passages; a cross-section of each of the flow passages in the axial direction overlaps a cross-section of the cover body; and a cross-sectional area of the gaps between the inner cylindrical body and the outer cylindrical body, the gaps being in communication with the respective flow passages, is set to a size that can obtain a predetermined flow velocity.

In this invention, there may be employed an arrangement in which each of the flow passages is arranged at an equal distance from one another in the circumferential direction and extends in the radial direction. Further, there may be employed an arrangement in which each of the outer peripheral side portions of the cover body has formed, over an entire circumferential direction, dents which are dented (or recessed) radially inward in a larger depth than the depth of the gaps, and each of the flow passages and the gaps are brought into communication with each other through the dents. In this case, preferably a splitting body extending in the axial direction is disposed in a position between respectively adjacent flow passages.

According to this invention, a cross-section of each of the fluid passages along the axial direction overlaps the cross-section of the cover body, in other words, on the inner side, as seen in cross section, of the cover body there is a cross section of the flow passages. Therefore, there can be prevented the can-roller itself from becoming larger in size as a consequence of the cover body inclusive of the flow passages getting larger in the axial direction. Further, as a result of constituting the flow passages by dividing them into a plurality of pieces, the specific surface area of the respective flow passages can be made smaller. As a consequence, the total amount of cooling water that flows through the cover body can be made smaller and, in addition, the endothermic or radiating area in each of the flow passages can be made smaller. As a result, the lowering in the effectiveness in heat exchanging with the sheet-like base material through the outer cylindrical body can be restrained to the best extent possible.

By the way, in case the can-roller and the sheet-like base material are used in an environment in which heat input can be received, the following arrangement is generally known in order to restrain the occurrence of the temperature distribution in the longitudinal and in the lateral direction. Namely, the arrangement in question is to provide, in protrusion in a spiral manner at a predetermined pitch, a protruded strip (one strip or two will do) on an outer cylindrical surface of the inner cylindrical body that is inserted onto the axial body. According to this arrangement, by causing the fluid at a predetermined temperature to flow from the axially one end toward the axially opposite end of the fluid passage that is sectioned by a protruded strip between the inner cylindrical body and the outer cylindrical body, the temperature distribution of the fluid inside the fluid passage can be restrained small enough to the extent possible. As a consequence, a relatively large temperature distribution in the longitudinal direction and in the lateral direction of the sheet-like base material can be prevented from occurring. This is considered to be due to the fact that the cross-sectional area is small (reduced) in the fluid passage to be partitioned by the protruded strip. Consequently, some degree of flow velocity can be secured to the fluid that flows through the fluid passage, whereby the heat transfer coefficient is improved. This arrangement, however, brings about a complex structure of the inner cylindrical body, thereby resulting in a higher product cost.

To the contrary, according to this invention, for example, when the fluid at a predetermined temperature is supplied to the inflow passage that extends from one axial end to the opposite axial end thereof along the axial body inside the inner cylindrical body, the fluid will be supplied respectively to each supply passage (first flow passage) of the cover body (first cover body) that is positioned on the axially opposite side and in communication with this inflow passage. In this case, if each of the first fluid passages that extend, e.g., in the radial direction is arranged in a plurality of pieces at an equal interval (spacing) in the circumferential direction, the fluid from the inflow passage can thus be dispersed to each of the first flow passages. The fluid from each of the first flow passages can thus be supplied into the gap between the inner cylindrical body and the outer cylindrical body substantially uniformly. Then through this gap can the fluid flow into the fluid passage (second fluid passage) of the other cover body (second cover body), and will be discharged to the outside through the outflow passage with which each of the second flow passages is in communication.

It is to be noted here that, according to the finding obtained as a result of diligent and strenuous researches by the inventors of the present application, the following points have been confirmed. Namely, the confirmation was to the effect that: that, as long as the cross-sectional area of the gap is throttled to the size that can obtain the flow velocity of the same degree as that of the fluid flowing through the fluid passage to be sectioned (or defined) by the above-mentioned protruded strip, the fluid respectively flown from the first fluid passages flows uniformly through the above-mentioned gap in the axial direction; and that, at this time, the temperature distribution of the fluid that flows through this gap (especially, in the axial direction) can be restrained to the smallest extent possible (in other words, the temperature difference between the fluid that flows into the gap and the fluid that flows out of the gap is minimized to the extent possible). In this case, it is made needless to spirally provide the outer cylindrical surface of the inner cylindrical body with protruded strips, thereby advantageously leading to an attempt to lower the cost of the product.

In addition, by providing the dents, they function as fluid reservoirs. In the first cover body, as a result of the fluid flowing out of the respective first flow passages once strikes against the inner wall of the outer cylindrical body and then dispersed into the circumferential direction (in other words, as a result of the fluid's wrapping around down to the portion positioned in the middle of the first flow passages adjoining to each other), the fluid flows into the gap between the inner cylindrical body and the outer cylindrical body, from substantially the entire circumferential direction. On the other hand, in the second cover body, the fluid flowing uniformly through the gap is once accepted and is thereafter discharged into the respective second flow passages. In this manner, the temperature distribution, in the circumferential direction, of the fluid flowing through this gap can be restrained to the smallest extent possible. In this case, by disposing the splitting bodies, the fluid that flows from the respectively first axially opposite branched flow passages into the gap without getting mixed, but flows uniformly toward axially one direction. The temperature distribution in the axial direction and in the circumferential direction of the fluid that flows through the gap can be restrained still smaller. In this case, the splitting body needs not completely separate the gap in the circumferential direction, but may be constituted, for example, by such a plate member or a wire member having a predetermined plate thickness or wire diameter as will be adhered to the outer cylindrical surface of the inner cylindrical body.

MODES FOR CARRYING OUT THE INVENTION

With reference to the accompanying drawings a description will now be made of an embodiment of a can-roller CR for use in a vacuum processing apparatus of this invention by citing an example in which a predetermined thin film is deposited (film formation), with a processing unit serving as a source of deposition, on a sheet-like base material Sw that is wound around a can-roller CR. In the following, the description is made provided: that the can-roller CR is housed inside the vacuum chamber Vc in a posture in which the axial line of the can-roller CR coincides with the horizontal direction; that the axial direction is defined as X-axis direction, that the direction perpendicular to the X-axis direction on the same horizontal plane is defined as Y-axis direction, and the vertical direction perpendicular to the X-axis and the Y-axis directions is defined as Z-axis direction; and that the directions such as "up" and "down" shall be based on FIG. 1.

Figure 1:
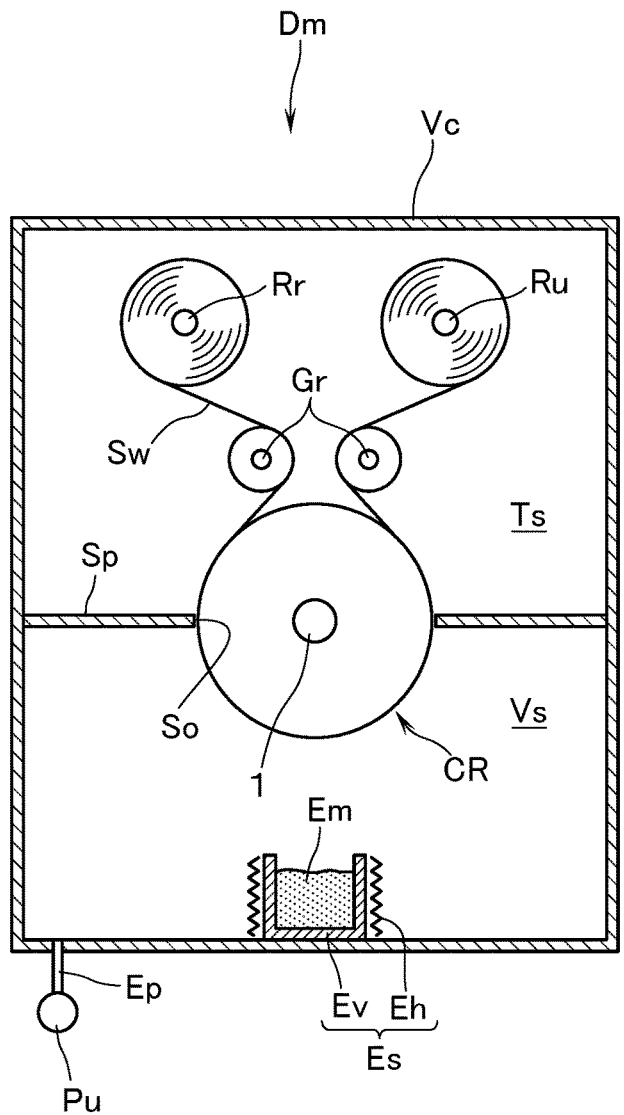
FIG. 1 is a schematic sectional view showing a vacuum processing apparatus provided with a can-roller of this embodiment.
Figure 1:
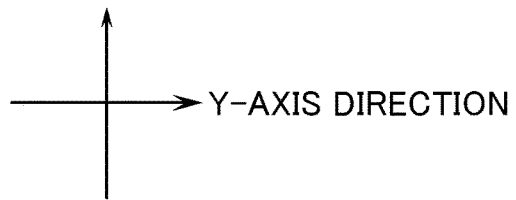

With reference to FIG. 1, the vacuum processing apparatus Dm provided with a can-roller CR according to this embodiment has a vacuum chamber Vc. The vacuum chamber Vc has connected thereto, through an exhaust pipe Ep, a vacuum pump unit Pu which is made up of a turbomolecular pump, rotary pump, and the like so that a vacuum atmosphere (e. g., $10^{-5}$ Pa) can be formed in the vacuum chamber Vc. In addition, the vacuum chamber Vc is divided into two chambers of an upper chamber and a lower chamber by means of a separating plate Sp. In that one (vapor deposition chamber Vs) of the chambers which is positioned on the lower side in FIG. 1, a vapor deposition source Es as a processing unit is disposed. As the vapor deposition source Es, there is utilized one having: a crucible Ev for containing therein vapor deposition material Em; and a heating means Eh, such as a sheath heater, for heating the vapor deposition material Em contained inside the crucible Ev. By means of heating the vapor deposition material Em contained inside the crucible Ev is sublimated or vaporized. The sublimated or vaporized evaporation particles are caused to be adhered and deposited on that part of the sheet-like base material Sw which is wound around a can-roller CR, thereby performing vapor deposition (film formation) of those particles. It is to be noted that the vapor deposition source Es is not limited to the above, but those of sputtering method or the CVD method may be used as well. Since known art may be utilized as those of sputtering method or the CVD method, further detailed description will be omitted.

In FIG. 1, the other chamber (transportation chamber Ts) that is positioned on the upper side has disposed therein: a feed roller Rr around which is wound the sheet-like base material Sw and which is driven for rotation by means of a motor (not illustrated) so as to feed the sheet-like base material Sw at a constant travel (transport) speed; and a take-up roller Ru which takes up the sheet-like base material Sw on which film deposition has been finished. On the inside of an opening So formed in a partition plate Sp, the can-roller CR of this embodiment, around which is wound the sheet-like base material Sw, is disposed in a manner to lie opposite to the vapor deposition source Es. In FIG. 1, the reference mark Gr denotes guide rollers.

Figure 2:
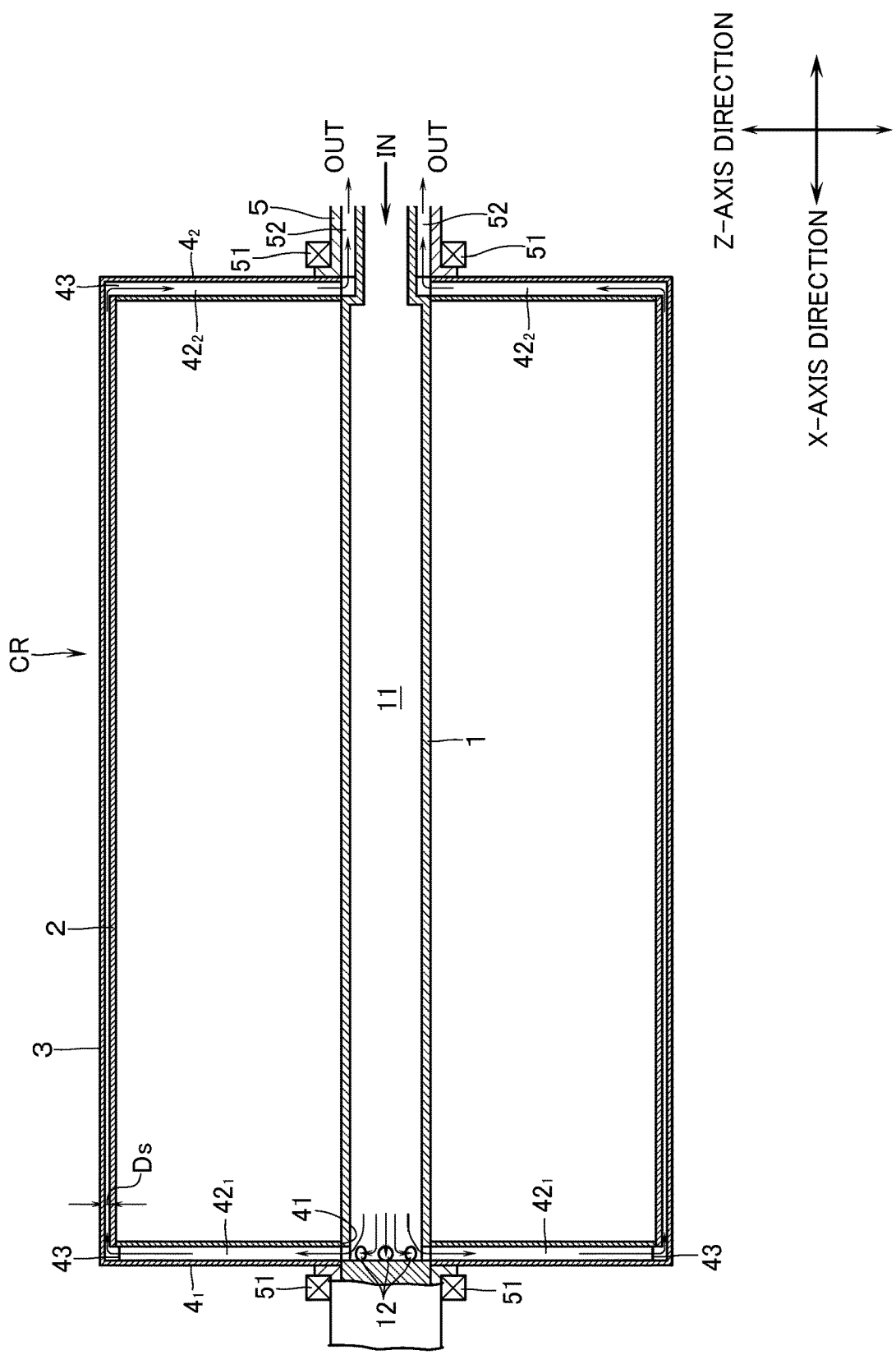
FIG. 2 is a sectional view showing the construction of the can-roller.
Figure 3:
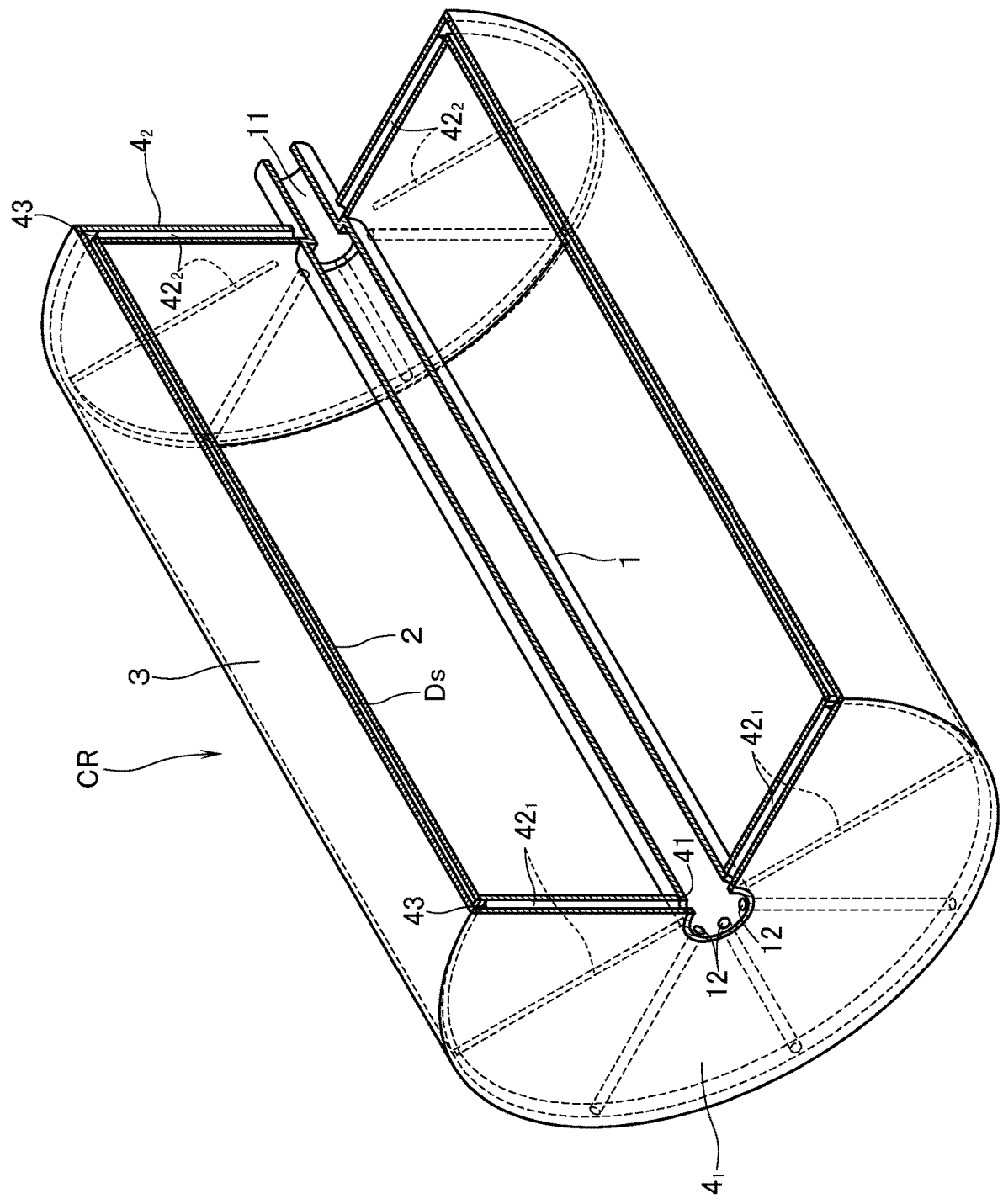
FIG. 3 is a perspective view showing the construction of the can-roller in a partially exploded manner.
Figure 4:
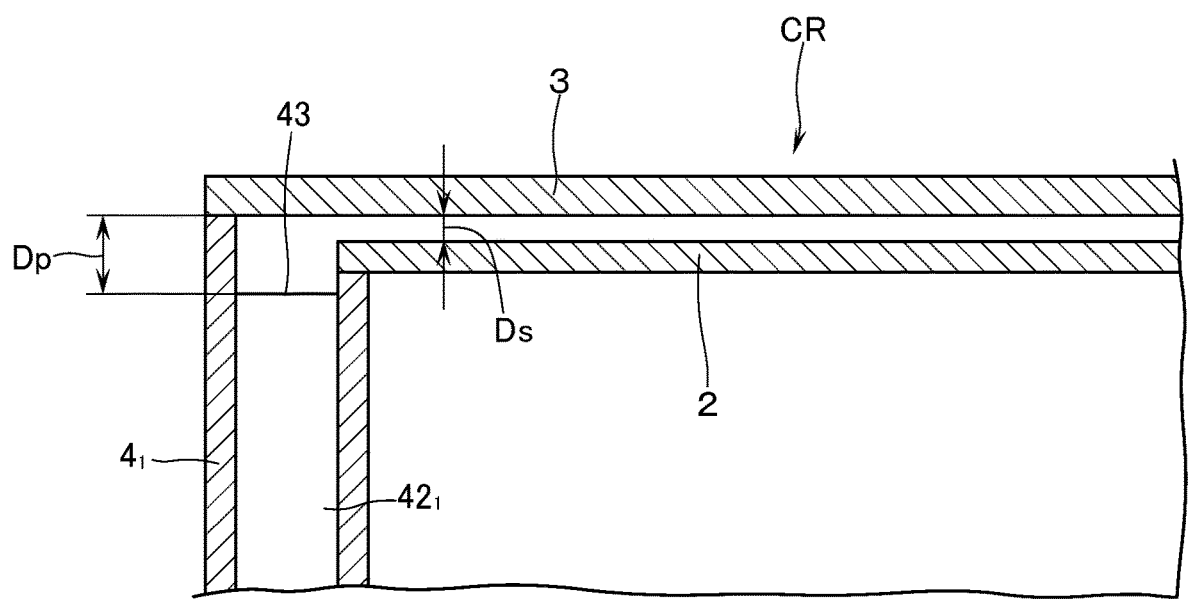
FIG. 4 is a sectional view showing by enlarging part of FIG. 2.
Figure 4:
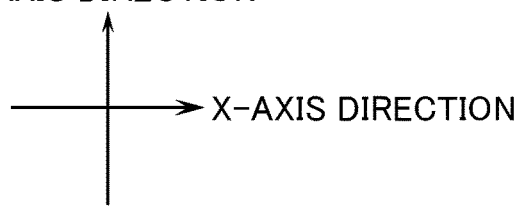

With reference to FIGS. 2 through 4, the can-roller CR is made up of an axial body 1; an inner cylindrical body 2 which is inserted onto an outside of the axial body 1; an outer cylindrical body 3 which encloses an outer cylindrical surface of the inner cylindrical body 2 with a gap Ds therebetween; and each of the first and second cover bodies $4_1$, $4_2$ which closes both ends, in the X-axis direction, of the inner cylindrical body 2 and the outer cylindrical body 3, respectively. A hollow axial body 5 whose one end is respectively fixed to each of the cover bodies $4_1$, $4_2$ is inserted onto that portion of the axial body 1 which protrudes outward from each of the cover bodies $4_1$, $4_2$. The axial body 5 is thus rotatably supported, through bearings 51, by a supporting body (not illustrated) disposed on a wall surface of the vacuum chamber Vc or inside the vacuum chamber Vc. When the axial bodies 1, 5 are rotated by a motor (not illustrated), the inner cylindrical body 2, the outer cylindrical body 3, and each of the cover bodies $4_1$, $4_2$ are arranged to be rotated for driving integrally at a predetermined speed. By the way, the method of mounting the axial bodies 1, 5 onto the vacuum chamber Vc in a rotatable manner can be used from a known one which utilizes a rotary joint and the like, and therefore no further details are given here.

Inside the axial body 1: there is formed an inner passage 11 as an inflow passage extending in the X-axis direction; one end (right side in FIG. 2) of the inner passage 11 is connected to a suction pipe (not illustrated) communicating to a chiller unit (not illustrated); and it is so arranged that there is supplied a fluid such as cooling water adequately selected depending on the vacuum processing to be performed inside the vacuum chamber Vc. In addition, the space between the outer cylindrical surface of the axial body 1 that is protruded outward from the second cover body $4_2$ on axially one side (right side in FIG. 2), and the inner cylindrical surface of the hollow axial body 5 constitutes an outlet passage 52 of the fluid as described hereinbelow. It is thus so arranged that the fluid to flow through each of the flow passages $42_2$ of the second cover body $4_2$ is discharged into the outlet passage 52 of the fluid and returns to the chiller unit (not illustrated). By the way, since the chiller unit itself is known, its detailed description will be omitted here.

The inner cylindrical body 2 and the outer cylindrical body 3 which are disposed in a manner concentric with each other are made of metal such as stainless steel. It is so dimensioned that the length of the generating line (X-axis direction) of the inner cylindrical body 2 is shorter than the outer cylindrical body 3. On the other hand, each of the first and the second cover bodies $4_1$, $4_2$ is made of metal such as stainless steel and is made of a solid disc-like member having a plate thickness corresponding to half the difference in length between the generating lines of the inner cylindrical body 2 and of the outer cylindrical body 3. The following arrangement is made: that the outside diameter of the portion that is positioned on the inner side in the Z-axis direction of each of the cover bodies $4_1$, $4_2$ coincides with the inside diameter of the inner cylindrical body 2; that the outside diameter of the portion that is positioned on the outer side in the Z-axis direction of each of the cover bodies $4_1$, $4_2$ is formed so as to coincide with the inside diameter of the outer cylindrical body 3; and that, by respectively fixedly fitting each of the cover bodies $4_1$, $4_2$ from both sides in the X-axis direction in a state in which the inner cylindrical body 2 and the outer cylindrical body 3 are concentrically disposed, both ends in the X-axis direction of each of the inner cylindrical body 2 and the outer cylindrical body 3 are respectively closed.

Further, each of the first and the second cover bodies $4_1$, $4_2$ is provided with a plurality of flow passages which are in communication with the central opening 41 through which the axial body 1 is inserted, and with a plurality of flow passages which are in communication with the central opening 41 (hereinafter each of the flow passages in the first cover body $4_1$ is referred to as "the first flow passage $42_1$," and each of the flow passages in the second cover body $4_2$ is referred to as "the second flow passage $42_2$"). As shown in FIGS. 2 and 3, the cross-sections of each of the flow passages $42_1$, $42_2$ along the axial direction are arranged to respectively overlap the cross-sections of the cover bodies $4_1$, $4_2$, respectively, i.e., are so arranged that the cross-sections of the flow passages $42_1$, $42_2$ are present on the inside, as seen in cross-section, of the cover bodies $4_1$, $4_2$. In addition, each of the flow passages $42_1$, $42_2$ is so arranged as to be respectively extended over the entire length of the diameter at a predetermined distance in the circumferential direction (at a spacing of 45 degrees in this embodiment). In this case, the cross-section of each of the flow passages $42_1$, $42_2$ is circular and its cross-sectional area is set as described below. Namely, the fluid to flow from each of the flow passages $42_1$, $42_2$ once strikes against the inner wall positioned in the axially end part of the outer cylindrical body 3, and the fluid is then dispersed in the circumferential direction. The cross-sectional area in question is set as small as possible within a range in which, relative to the gap Ds, there can be secured a flow rate enough to cause the fluid to flow therein from the entire circumference. By the way, the above arrangement can materialize a constitution in which, because the cross-sectional area of each of the flow passages $42_1$, $42_2$ is circular in cross section and is in the shape of a straight pipe, the specific surface area can be minimized, and also the constitution of bringing about the minimization of the pipe line resistance is materialized.

Further, in a state in which the can-roller CR has been assembled, there will be formed communication holes 12 to communicate between the inner passage 11 and the first flow passages $42_1$, respectively. The phase of each of the flow passages $42_1$, $42_2$ is so arranged as to coincide with one another among each of the cover bodies $4_1$, $4_2$. In addition, along an entire circumference of the outside surface of the cover bodies $4_1$, $4_2$, there are formed, e.g., by counterboring processing dents (recessed parts) 43 which are dented radially inward at a depth Dp which is larger than the gap Ds. In this case, the depth Dp from the outer peripheral surface of the inner cylindrical body 2 may be appropriately set depending on the number of the branched flow passages $42_1$, $42_2$ to be formed, e.g., on the cover bodies $4_1$, $4_2$. Setting is made above two times, preferably four times, the gap Ds.

In the above-mentioned can-roller CR, when a fluid at a predetermined temperature is supplied to the inner passage 11 through a feed water pipe by means of a chiller unit (not illustrated), the fluid will be supplied to each of the first flow passages $42_1$ of the first cover body $4_1$. In this case, because each of the first flow passages $42_1$ is disposed in a plurality of pieces at equal distance from one another in the circumferential direction, and the dents 43 are present along the outer surface of the first cover body $4_1$, the fluid from each of the first flow passages $42_1$ flows into the gap Ds between the inner cylindrical body 2 and the outer cylindrical body 3 substantially equally. Then, the fluid flows through the gap Ds into the dents 43 of the second cover body $4_2$ and flows from each of the second flow passages $42_2$ toward the outlet passage 52 and returns to the chiller unit. In other words, the dents 43 serve the purpose of fluid reservoirs; in the first cover body $4_1$ the fluid that flows from each of the first flow passages $42_1$ once strikes against the inner wall that is positioned at an axial end part of the outer cylindrical body 3 and is then circumferentially dispersed (in other words, the fluid wraps around the portion positioned in the intermediate of the first flow passages $42_1$ that are adjacent to each other); the fluid flows into the gap Ds from substantially entire circumferential direction; on the other hand, in the second cover body $4_2$ the fluid that has uniformly flown through the gap Ds will once be accepted and thereafter comes to be discharged into each of the second flow passages $42_2$.

By the way, in case the can-roller CR or the sheet-like base material Sw receives heat input at the time of vapor deposition, it is necessary to restrain the temperature distribution in the longitudinal direction and in the lateral direction from getting generated in the sheet-like base material Sw. A can-roller was manufactured (comparative product 1) in the following manner: i.e., a spiral protrusion was formed at a pitch of 15 mm on an outer cylindrical surface of the inner cylindrical body of a total length of 3300 mm; an outer cylindrical body was externally inserted such that the gap (corresponding to Ds in this invention) between the inner cylindrical body and the outer cylindrical body was 25 mm; and cover bodies having a branched flow passage leading to a flow inlet and a flow outlet of the fluid flow passage between the inner cylindrical body and the outer cylindrical body that were partitioned by the protrusion was screwed in, thereby manufacturing a can-roller. Then, under conditions in which the can-roller was heated, a fluid of 288K in temperature was caused to flow from axially one end to the opposite end from the branched flow passage to a fluid flow passage from an axial one end toward the opposite end thereof. The temperature difference between the inlet and the outlet in the flow passage was measured and the difference thereof was found to be 2K and the flow velocity at that time was about 0.8 m/sec. Then, an inner cylindrical body having no spiral protrusion was prepared and a can-roller was manufactured in the same manner as in the comparative product 1 (comparative product 2). Then, under the same conditions as in the above-mentioned case, a fluid at 288K was caused to flow from one axial end toward the opposite end of the fluid flow passage between the inner cylindrical body and the outer cylindrical body. The temperature difference between the inlet and the outlet in the flow passage was then measured and the difference thereof was found to be 40K. It has thus been confirmed that the temperature distribution of the fluid became large.

Then, in the embodiment of this invention, in order to make the fluid flow velocity that flows through the gap Ds to be equivalent to that of the comparative product 1, the outer cylindrical body 3 was inserted onto the outside of the inner cylindrical body 2 so that the gap Ds between the inner cylindrical body 2 without protrusion and the outer cylindrical body 3 becomes 5 mm. At the same time, there was manufactured a can-roller CR (this invention product) in which the first flow passage $42_1$ and the second flow passage $42_2$ were respectively formed at an interval of 30 degrees on the cover bodies $4_1$, $4_2$. Then, under the same conditions as in the above-mentioned case, a fluid at 288K was caused to flow from one axial end toward the opposite end of the gap Ds serving as the flow passage between the inner cylindrical body 2 and the outer cylindrical body 3 on the same conditions as above. The temperature difference between the inlet and the outlet of the gap Ds in the flow passage was then measured. The difference between the inlet and the outlet was confirmed to be about 1K, which was equivalent to that of the comparative product 1. In this invention product, on the outlet side of the gap Ds, there occurred a temperature distribution in which a relatively higher temperature portion and a relatively lower temperature portion in the circumferential direction reciprocally repeated. Therefore, this invention product was formed in each of the cover bodies $4_1$, $4_2$ with dents 43 having four times the depth as compared with that of the gap Ds. It was then confirmed that there disappeared the temperature distribution in which the relatively higher temperature portion and the relatively lower temperature portion alternately repeated in the circumferential direction.

According to the above-mentioned embodiments, because the axial cross-section of each of the flow passages $42_1$, $42_2$ overlaps the cross-section of the cover bodies $4_1$, $4_2$, in other words, because the cross-section of the flow passages $42_1$, $42_2$ is present on the inside of the cover bodies $4_1$, $4_2$ as seen in the cross-section, there can be prevented enlargement of the can-roller CR itself caused by axial enlargement of the cover bodies $4_1$, $4_2$ inclusive of the flow passages $42_1$, $42_2$.

In addition, since the flow passages $42_1$, $42_2$ are constituted by dividing them into a plurality of pieces, the specific surface area of the respective flow passages can be made smaller, and the total volume of the cooling water that flows through the cover bodies $4_1$, $4_2$ can be made smaller. In addition, the area of heat absorption or heat radiation in each of the flow passages $42_1$, $42_2$ is made smaller and, therefore, lowering in the effectiveness of heat exchanging with the sheet-like base material Sw through the outer cylindrical body 3 can be restrained to the extent possible. In addition, without spirally disposing the protrusion on the outer cylindrical surface of the inner cylindrical body 2, the temperature distribution in the axial direction and in the radial direction of the fluid that flows through the gap Ds (i.e., the temperature difference between the fluid flowing into the gap Ds and the fluid flowing out of the gap Ds) can be restrained smaller. The possibility of giving rise to the temperature distribution in the longitudinal direction and in the lateral direction of the sheet-like base material Sw can be restrained to the extent possible.

Descriptions have so far been made of the embodiments of this invention, but this invention shall not be limited to the above-mentioned embodiments. As far as the substance of this invention is not departed from, various modifications are available. In the above-mentioned embodiments, a description was made of a film-forming processing as an example of the vacuum processing. This invention can, however, be applicable to other vacuum processing such as heat treatment, etching processing and the like. In addition, description was made of cooling water as the coolant, but this invention shall not be limited to the above. Instead, this invention can be applied to a case in which, during the time when hot water heated to a predetermined temperature is caused to flow so as to perform a predetermined vacuum processing, the sheet-like base material Sw is controlled in temperature to a predetermined temperature.

Figure 5A:
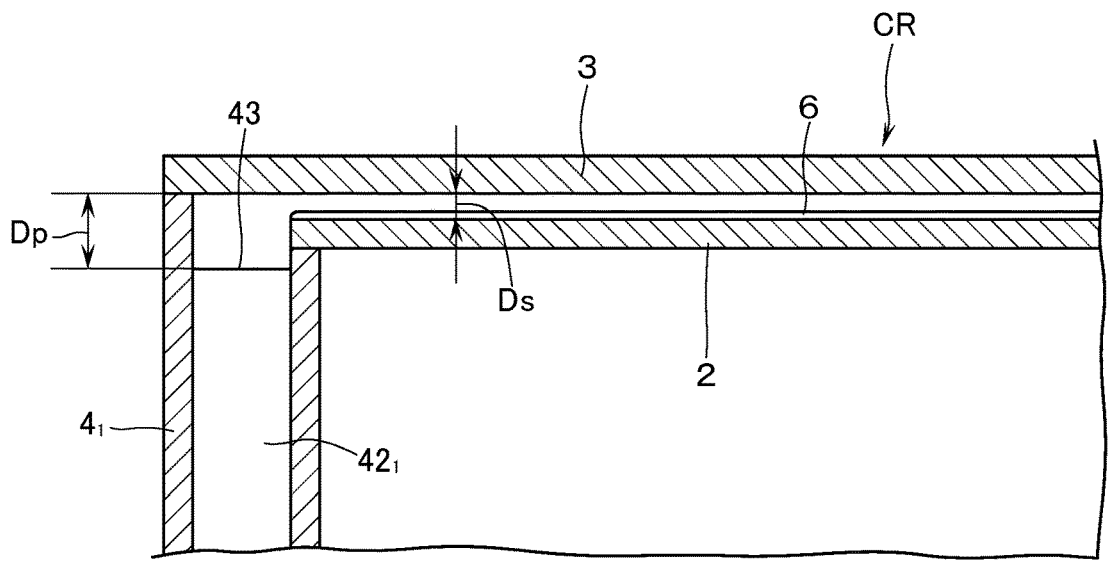
FIG. 5(a) and FIG. 5(b) are partially enlarged sectional views of the can-roller relating to a modified example.
Figure 5B:
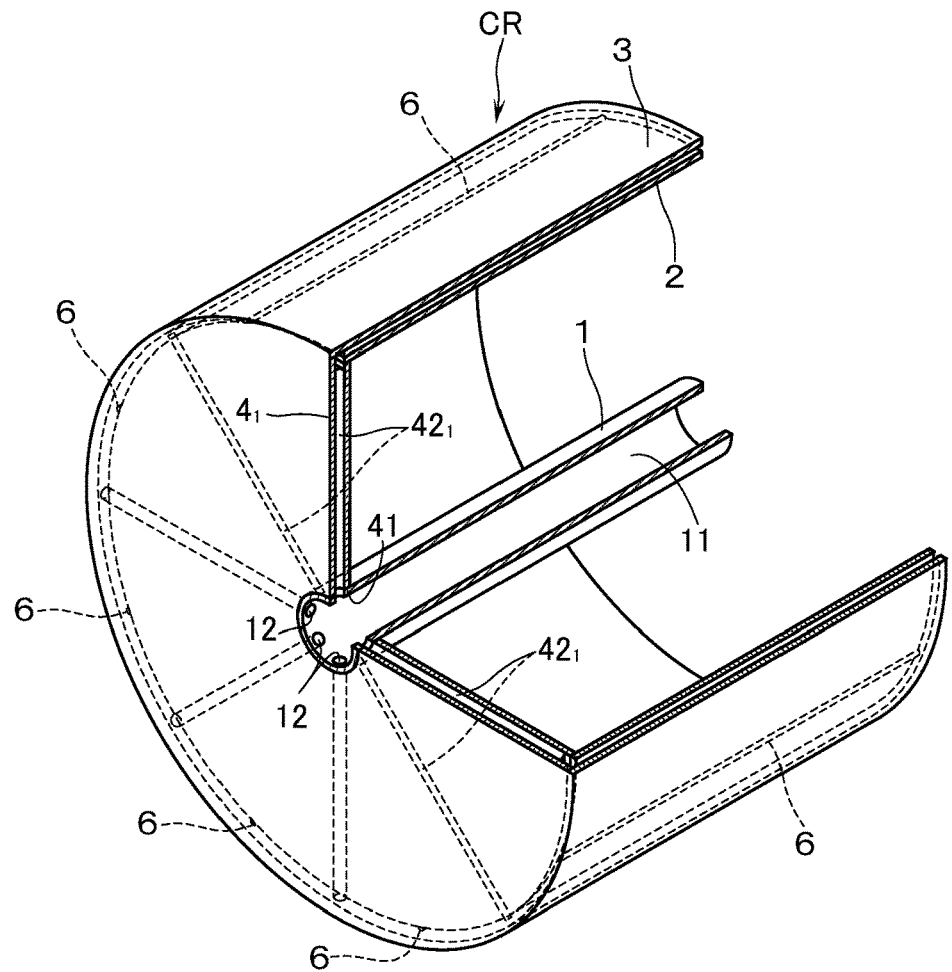

In addition, in the above-mentioned embodiment, description has been made of an example in which there was no member or element in the gap Ds between the inner cylindrical body 2 and the outer cylindrical body 3, but this invention shall not be limited to the above. For example, as shown in FIG. 5(a) and FIG. 5(b), splitting bodies 6 may be disposed in the gap Ds in a manner to axially extend in a position between the branched flow passages $42_1$, $42_2$. The splitting bodies 6 may be constituted by a plate material having a predetermined plate thickness or wire material which is to be adhered to the outer cylindrical surface, e.g., of the inner cylindrical body 2. According to this arrangement, the fluid flowing from each of the axially opposite first branched flow passages $42_1$ into the gap Ds can be secured to flow uniformly toward axially one direction without getting mixed. As a result, the temperature distribution, in the axial direction and in the circumferential direction, of the fluid to flow through the gap Ds can be restrained all the more small.

Furthermore, in the above-mentioned embodiment, description was made of an example in which each of the cover bodies $4_1$, $4_2$ is constituted by a circular disk-shaped member and in which each of the cover bodies $4_1$, $4_2$ has formed therein each of the flow passages $42_1$, $42_2$ so as to extend respectively over the entire radial direction in the circumferential direction at a predetermined distance from one another. However, as far as the cross-section of each of the flow passages $42_1$, $42_2$ respectively overlaps the cross-section of the cover bodies $4_1$, $4_2$, there is no reason for restricting this invention to the above. Although not described by particularly illustrating, it may be so arranged that two pieces of plate materials are adhered together by means of a columnar structural member (for example, fabricated into a honey-comb structure and a part thereof is left open as a flow passage), it can also be made into a matrix type of flow passage structure.

DESCRIPTION OF REFERENCE MARKS

CR can-roller
Dm vacuum processing apparatus
Es vapor deposition source (processing unit)
Sw sheet-like base material
Vc vacuum chamber
1, 5 shaft body
2 inner cylindrical body
3 outer cylindrical body
Ds gap between inner cylindrical body 2 and outer cylindrical body 3
$4_1$, $4_2$ cover body
$42_1$, $42_2$ branched flow passage
43 dent
6 splitting body

The invention claimed is:

1. A can-roller for a vacuum processing apparatus which performs a predetermined vacuum processing inside a vacuum chamber on a surface of a sheet-like base material while keeping the base material travelling, the can-roller being disposed to lie opposite to a processing unit which performs the vacuum processing, the can-roller being rotatable and around which the sheet-like base material being wound, the can-roller comprising:
an axial body;
an inner cylindrical body to be inserted onto an outside of the axial body;
an outer cylindrical body enclosing an outer cylindrical surface of the inner cylindrical body with a gap therebetween; and
cover bodies for respectively closing axially each end of the inner cylindrical body and the outer cylindrical body,
wherein each of the cover bodies has a plurality of flow passages located inside of each of the cover bodies;
a cross-section of each of the flow passages in the axial direction overlaps a cross-section of each of the cover bodies; and
a cross-sectional area of the gap between the inner cylindrical body and the outer cylindrical body, the gap being in communication with the respective flow passages, is set to a size that can obtain a predetermined flow velocity.

2. The can-roller for use in a vacuum processing apparatus according to claim 1, wherein each of the flow passages is arranged at an equal distance from one another in the circumferential direction and extends in the radial direction.

3. The can-roller for use in a vacuum processing apparatus according to claim 1, wherein each of outer peripheral side portions of the cover bodies body has formed, over an entire circumferential direction, dents which are recessed radially inward in a larger depth than the depth of the gap, and wherein each of the flow passages and the gap are brought into communication with each other through the dents.

4. The can-roller for use in a vacuum processing apparatus according to claim 2, wherein a splitting body extending in the axial direction is disposed in a position between respectively adjacent flow passages.

5. The can-roller for use in a vacuum processing apparatus according to claim 1, wherein each of the flow passages is in a shape of a straight pipe.

\* \* \* \* \*